US010438656B2

(12) United States Patent
Madraswala et al.

(10) Patent No.: US 10,438,656 B2
(45) Date of Patent: Oct. 8, 2019

(54) SYSTEM AND METHOD FOR PERFORMING A CONCURRENT MULTIPLE PAGE READ OF A MEMORY ARRAY

(71) Applicant: Intel Corporation, Santa Clara, CA (US)

(72) Inventors: Aliasgar S. Madraswala, Folsom, CA (US); Bharat M. Pathak, Folsom, CA (US); Binh N. Ngo, Folsom, CA (US); Naveen Vittal Prabhu, Folsom, CA (US); Karthikeyan Ramamurthi, Folsom, CA (US); Pranav Kalavade, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/845,500

(22) Filed: Dec. 18, 2017

(65) Prior Publication Data

US 2019/0043564 A1 Feb. 7, 2019

(51) Int. Cl.

*G11C 16/26* (2006.01)
*G11C 11/56* (2006.01)
*G11C 16/08* (2006.01)
*G11C 8/08* (2006.01)
*G11C 16/32* (2006.01)

(52) U.S. Cl.

CPC ............ *G11C 11/5642* (2013.01); *G11C 8/08* (2013.01); *G11C 16/08* (2013.01); *G11C 16/26* (2013.01); *G11C 16/32* (2013.01); *G11C 2211/5631* (2013.01)

(58) Field of Classification Search

CPC ...... G11C 11/5642; G11C 16/08; G11C 16/26
USPC .................................................... 365/185.03
See application file for complete search history.

(56) References Cited

U.S. PATENT DOCUMENTS 9,189,389 B2 * 11/2015 Kojima ............... G06F 12/0246
9,257,193 B2 * 2/2016 Oh ....................... G11C 7/1021
2013/0028021 A1 * 1/2013 Sharon ................ G11C 11/5642 365/185.17
2014/0133242 A1 * 5/2014 Oh ....................... G11C 7/1021 365/185.18
2014/0146612 A1 * 5/2014 Helm ...................... G11C 7/18 365/185.18
2015/0380097 A1 * 12/2015 Sato ........................ G11C 8/08 365/185.03
2016/0049206 A1 * 2/2016 Huynh .................. G11C 16/30 365/185.21

* cited by examiner

*Primary Examiner* — Xiaochun L Chen
(74) *Attorney, Agent, or Firm* — Grossman, Tucker, Perreault & Pfleger, PLLC

(57) ABSTRACT

A system for facilitating multiple concurrent page reads in a memory array is provided. Memory cells that have multiple programming states (e.g., store multiple bits per cell) rely on various control gate and wordline voltages levels to read the memory cells. Therefore, to concurrently read multiple pages of memory cells, where each page includes one or more different programming levels, a memory controller includes first wordline control logic that includes a first voltage regulator and includes second wordline control logic that includes a second voltage regulator, according to one embodiment. The two voltage regulators enable the memory controller to concurrently address and access multiple pages of memory at different programming levels, in response to memory read requests, according to one embodiment.

23 Claims, 5 Drawing Sheets

SYSTEM AND METHOD FOR PERFORMING A CONCURRENT MULTIPLE PAGE READ OF A MEMORY ARRAY

TECHNICAL FIELD

The present disclosure relates to systems and methods for increasing memory read speeds.

BACKGROUND

Users of memory devices value the speed with which information can be transferred to and from the memory devices. For example, if a user of a 64 Gigabyte ("GB") thumb drive or other memory device can transfer all of the content of the thumb drive in 5 minutes instead of 8-10 minutes, the faster drive is likely to sell more favorably to consumers. Even though memory manufacturers are aware of the benefits of increasing transfer rates, such as data access rates, silicon real estate is valuable and increasing (rather than decreasing) the size of a memory die is counter to the goal of achieving smaller memory footprints.

BRIEF DESCRIPTION OF THE DRAWINGS

Features and advantages of various embodiments of the claimed subject matter will become apparent as the following Detailed Description proceeds, and upon reference to the Drawings, wherein like numerals designate like parts, and in which:

Figure 1:
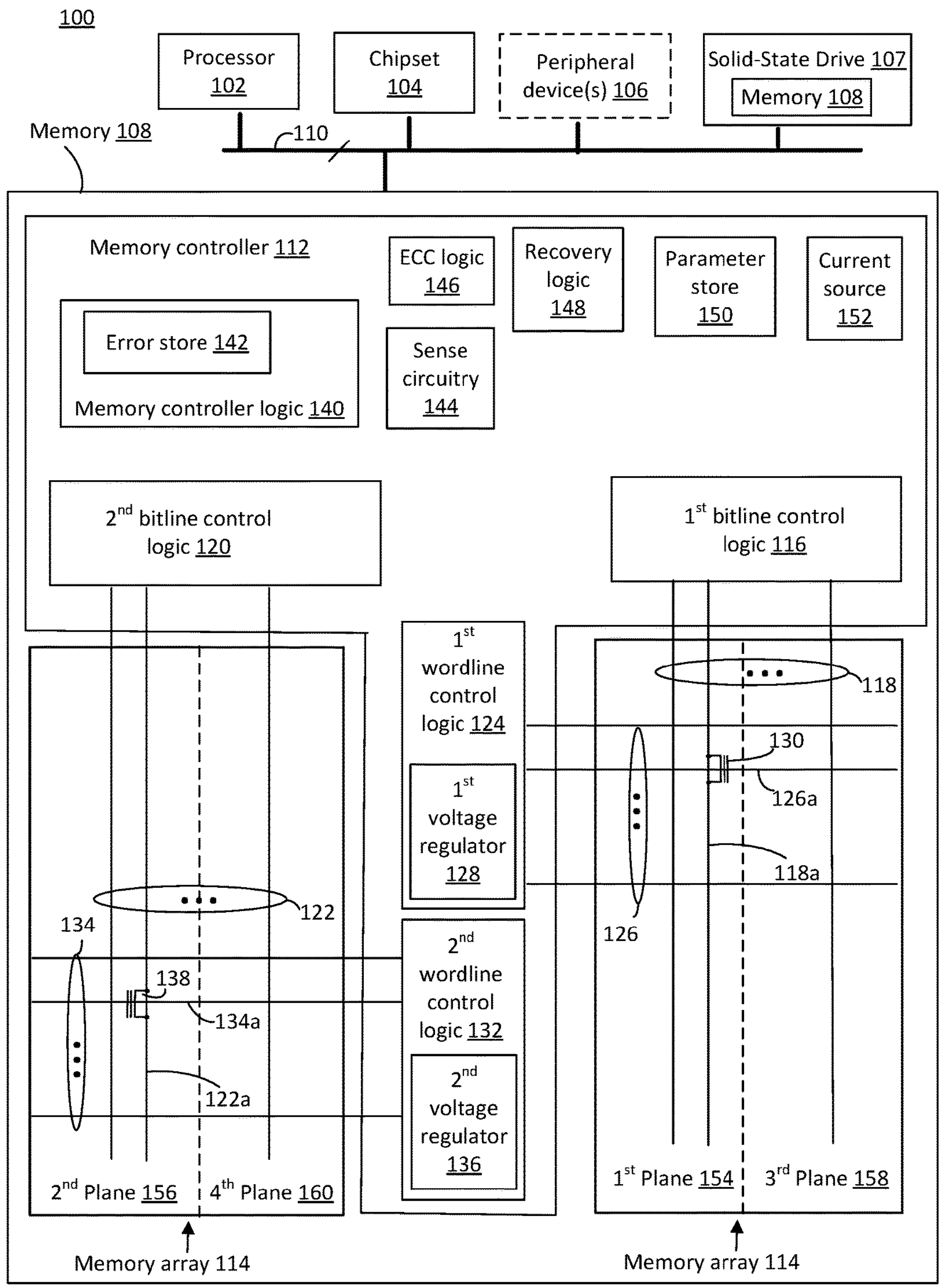
FIG. 1 is a schematic depicting an illustrative system that concurrently provides multiple page reads from a memory array to increase the read speed of a memory, according to one embodiment.

Although the following Detailed Description will proceed with reference being made to illustrative embodiments, many alternatives, modifications and variations thereof will be apparent to those skilled in the art.

DETAILED DESCRIPTION

The system and method disclosed herein increases the speed by which a memory array in a memory die or in a memory system may be read, without increasing the footprint size of a memory die, according to one embodiment. Read requests of a memory are received by the memory serially (e.g., one after another), and the memory may fulfill memory read requests by addressing and accessing a page of memory cells. If multiple pages of memory cells could be accessed concurrently, responses to read requests could occur at faster speeds.

Memory cells that have multiple programming levels (e.g., store multiple bits) rely on various control gate and wordline voltages levels to read the memory cells. Therefore, to concurrently read multiple pages of memory cells, where each page includes one or more different programming levels, a memory controller includes first wordline control logic that includes a first voltage regulator and includes second wordline control logic that includes a second voltage regulator, according to one embodiment. The two voltage regulators enable the memory controller to concurrently address and access multiple pages of memory at different programming levels, in response to memory read requests, according to one embodiment. In consideration of concerns regarding expanded use of silicon real estate, the second voltage regulator (and the second wordline control logic) are fabricated using CMOS under the array techniques (e.g., are fabricated under or before the fabrication of the memory cell array), according to one embodiment.

A memory controller is provided, according to one embodiment. The memory controller includes first wordline control logic to generate a first voltage level to apply to first wordlines of a memory array of memory cells, according to one embodiment. The memory controller includes second wordline control logic to generate a second voltage level to apply to second wordlines of the memory array of memory cells concurrent with the first wordline control logic generating the first voltage level, according to one embodiment.

A system is provided, according to one embodiment. The system includes a memory array having a plurality of memory cells, wherein each of the memory cells is to store at least four programming levels that corresponds with at least two bits of data, according to one embodiment. The system includes a memory controller, according to one embodiment. The memory controller includes first wordline control logic to generate a first voltage level to apply to first wordlines of the memory array, according to one embodiment. The memory controller includes second wordline control logic to generate a second voltage level to apply to second wordlines of the memory array concurrent with the first wordline control logic generating the first voltage level, according to one embodiment.

A computer readable storage device is provided, according to one embodiment. The computer readable storage device stores instructions that when executed by one or more processors result in operations, according to one embodiment. The operations include concurrently generate a first voltage level with first wordline control logic and a second voltage level with second wordline control logic, according to one embodiment. The operations include apply the first voltage level to a first wordline to read a first page of memory cells in a memory array and concurrently apply the second voltage level to a second wordline to read a second page of memory cells in the memory array, according to one embodiment.

A method is provided, according to one embodiment. The method includes concurrently generating a first voltage level with first wordline control logic and a second voltage level with second wordline control logic, according to one embodiment. The method includes applying the first voltage level to a first wordline to read a first page of memory cells in a memory array and concurrently apply the second voltage level to a second wordline to read a second page of memory cells in the memory array, according to one embodiment.

FIG. 1 depicts an illustrative system 100 that concurrently provides multiple page reads from a memory array to increase the read speed of a memory, according to one embodiment. System 100 may correspond to a computing device including, but not limited to, a server, a workstation computer, a desktop computer, a laptop computer, a tablet computer (e.g., iPad®, GalaxyTab® and the like), an ultraportable computer, an ultramobile computer, a netbook computer and/or a subnotebook computer; a mobile telephone including, but not limited to a smart phone, (e.g., iPhone®, Android®-based phone, Blackberry®, Symbian®-based phone, Palm®-based phone, etc.) and/or a feature phone.

The system 100 may include a processor 102 that is communicatively coupled to a chipset 104, peripheral device(s) 106, a solid-state drive ("SSD") 107, and a memory 108, according to one embodiment. The processor 102, the chipset 104, the peripheral device(s) 106, the sold-state drive 107, and the memory 108 are communicatively and/or physically coupled to each other through one or more buses 110, according to one embodiment. The processor 102 may correspond to a single core or a multi-core general purpose processor, such as those provided by Intel® Corporation, etc., according to one embodiment. The chipset 104 may include, for example, a set of electronic components that includes the one or more buses 110 to facilitate communication between components of the system, and that manages data flow between the processor 102, the solid-state drive 107, the memory 108, and the peripheral device(s) 106, according to one embodiment. The peripheral device(s) 106 may include, for example, user interface device(s) including a display, a touch-screen display, printer, keypad, keyboard, etc., communication logic, wired and/or wireless, storage device(s) including hard disk drives ("HDD"), solid-state drives, removable storage media, etc., according to one embodiment.

The memory 108 is coupled to the processor 102 and is configured to receive instructions, receive addresses, receive data, and provide data to the processor 102, in response to one or more instructions received from the processor 102, according to one embodiment. The memory 108 may be part of or may be included in the solid-state drive 107, according to one embodiment. Communications between the processor 102 and the solid-state drive 107 may occur over the one or more buses 110 using one or more of a variety of hardware/communications protocols including, but not limited to, SCSI (Small Computer System Interface), SAS (Serial Attached SCSI), PCIe (Peripheral Component Interconnect Express), NVMe (Non-Volatile Memory Express), SATA (Serial ATA (Advanced Technology Attachment)). The memory 108 may be a storage device that includes one or more memory controllers and one or more memory dice, according to one embodiment. The memory 108 may be a single memory die, according to one embodiment. The memory 108 is configured to provide requested data to the processor by performing multiple page reads of a memory array of the memory 108, according to one embodiment. The memory 108 may be a non-volatile memory, e.g., a storage medium that does not require power to maintain the state of data stored by the storage medium, according to one embodiment. Non-volatile memory may include, but is not limited to, a NAND flash memory (e.g., Single-Level Cell ("SLC"), Multi-Level Cell ("MLC"), Quad-Level Cell ("QLC"), Tri-Level Cell ("TLC"), or some other NAND), NOR memory, solid state memory (e.g., planar or three-dimensional (3D) NAND flash memory or NOR flash memory), storage devices that use chalcogenide phase change material (e.g., chalcogenide glass), byte addressable nonvolatile memory devices, ferroelectric memory, silicon-oxide-nitride-oxide-silicon (SONOS) memory, polymer memory (e.g., ferroelectric polymer memory), byte addressable random accessible 3D XPoint™ memory, ferroelectric transistor random access memory (Fe-TRAM), magnetoresistive random access memory (MRAM), phase change memory (PCM, PRAM), resistive memory, ferroelectric memory (F-RAM, FeRAM), spin-transfer torque memory (STT), thermal assisted switching memory (TAS), millipede memory, floating junction gate memory (FJG RAM), magnetic tunnel junction (MTJ) memory, electrochemical cells (ECM) memory, binary oxide filament cell memory, interfacial switching memory, battery-backed RAM, ovonic memory, nanowire memory, electrically erasable programmable read-only memory (EEPROM), etc. In some embodiments, the byte addressable random accessible 3D XPoint™ memory may include a transistor-less stackable cross point architecture in which memory cells sit at the intersection of words lines and bitlines and are individually addressable and in which bit storage is based on a change in bulk resistance, in accordance with various embodiments.

The memory 108 includes a memory controller 112 that is configured to address, write to, and read from, a memory array 114, according to one embodiment. The memory controller 112 is configured to perform memory access operations, e.g., reading a target memory cell and/or writing to a target memory cell, ECC check operations and memory cell recovery operations, according to one embodiment. The memory array 114 includes a plurality of memory cells that are organized by one or more strings (e.g., columns), pages (e.g., wordlines or rows), blocks, planes, and tiles of memory cells, according to one embodiment.

The memory controller 112 uses bitline control logic and wordline control logic to address and access the memory array 114, according to one embodiment. The memory controller 112 includes first bitline control logic 116 that controls a plurality of bitlines 118 (individually, for example, bitline 118*a*) and includes second bitline control logic 120 that controls a plurality of bitlines 122 (individually, for example, bitline 122*a*), according to one embodiment. The first bitline control logic 116 and the second bitline control logic 120 each include controller logic for inhibit voltages for their respective portions (e.g., planes) of the memory array 114, according to one embodiment. The memory controller 112 includes first wordline control logic 124 that applies voltage levels to a plurality of wordlines 126 (individually, for example, wordline 126*a*), according to one embodiment. The first wordline control logic 124 includes a first voltage regulator 128 that generates one or more threshold voltages to access memory cells (e.g., a memory cell 130) within the memory array 114, according to one embodiment. The memory controller 112 includes second wordline control logic 132 that applies voltage levels to a plurality of wordlines 134 (individually, for example, wordline 134*a*), according to one embodiment. The second wordline control logic 132 includes a second voltage regulator 136 that generates one or more threshold voltages to access memory cells (e.g., a memory cell 138) within the memory array 114, according to one embodiment.

The first wordline control logic 124 and the second wordline control logic 132 are configured to receive target wordline address(es) from the memory controller 112 and to concurrently select or access to or more wordlines for reading (or writing operations), according to one embodiment. For example, the first wordline control logic 124 may be configured to select a target wordline by coupling a wordline select bias voltage from the first voltage regulator 128 to the target wordline(s). The first wordline control logic 124 may be configured to deselect one or more target wordlines by decoupling the target wordline(s) from the wordline select bias voltage and/or by coupling a wordline deselect bias voltage to the wordline, according to one embodiment. The first wordline control logic 124 and the second wordline control logic 132 include global wordline drivers, according to one embodiment. The first wordline control logic 124 and the second wordline control logic 132 include select gate source ("SGS") and select gate drain ("SGD") drivers, according to one embodiment. The first voltage regulator 128 and the second voltage regulator 136 are wordline ("WL") regulators, according to one embodiment.

An advantage of the configuration of the memory controller 112 and of the memory array 114 is that including a first wordline control logic 124 and a second wordline control logic 132 enables the memory 108 to concurrently access multiple pages (e.g., wordlines) of the memory array 114, according to one embodiment. By concurrently accessing multiple pages of the memory array 114, the memory controller 112 and the memory 108 enable faster random read times (e.g., reduced memory access times), according to one embodiment. A random read of the memory array 114, as used herein, refers to operation that is used to read all or substantially all of the memory array 114, according to one embodiment.

The configuration of the first wordline control logic 124 and the second wordline control logic 132 (more specifically, the first voltage regulator 128 and the second voltage regulator 136) enables the memory controller 112 to concurrently access multiple pages (e.g., wordlines) of memory cells in the memory array 114 while accessing memory cells of varying program levels. In SLC and other traditional memory configuration, each memory cell may be limited to storing one bit of information with two possible states a logic 0 or a logic 1, so a single voltage regulator could potentially be used to supply a voltage level to multiple wordlines, for example, that are associated with different sets of bitlines. However, in MLC, TLC, QLC, and other types of multi-level cell memory arrays, each memory cell stores more than one bit per cell and may be programmed to multiple programming levels, and a single voltage reference is limited to accessing a single programming level (e.g., a single threshold voltage), according to one embodiment.

To further illustrate the benefits of multiple wordline voltage regulators (e.g., the first wordline control logic 124 and the second wordline control logic 132), a brief introduction to programming levels in a NAND flash memory cell is provided, according to one illustrative embodiment. The memory cells 130 and 138 include floating gates, which store charges that affect and at least partially define the threshold voltages ("Vth") for the transistors that constitute the memory cells 130 and 138, according to one embodiment. If the memory cells 130 and 138 were TLC memory cells, each cell would be programmable to programming levels L0, L1, L2, L3, L4, L 5, L6, and L7, according to one embodiment. TLC memory cells may be configured to store charge that is representative of up to a 3-bit binary value, according to one embodiment. Table 1 includes examples of programming level information for an example TLC memory cell

TABLE 1

| Program Level | Program Voltage | Threshold Voltage | Binary Value |
|---|---|---|---|
| L0 | 13 V | −.5 V | 111 |
| L1 | 15 V | .5 V | 011 |
| L2 | 16 V | 1.4 V | 001 |
| L3 | 17 V | 2.1 V | 101 |
| L4 | 18 V | 2.6 V | 100 |
| L5 | 19 V | 3.3 V | 000 |

TABLE 1-continued

| Program Level | Program Voltage | Threshold Voltage | Binary Value |
|---|---|---|---|
| L6 | 20 V | 3.8 V | 010 |
| L7 | 21 V | 4.5 V | 110 |

(e.g., memory cell 130, 138) that may be implemented in the memory array 114, according to one embodiment. The programming levels of Table 1 include L0, L1, L2, L3, L4, L5, L6, and L7, according to one embodiment. A memory cell may be configured to store more or fewer programming levels, according to one embodiment. An example programming voltage level that may be applied to a wordline or control gate of a memory cell to a specific program level is provided in Table 1, according to one embodiment. The program voltages, threshold voltages, and corresponding digital values are merely examples of values and other values may be used, in accordance with various implementations of the technology. In practice, a programming voltage level is applied to a memory cell during a programming operation, and the threshold voltage of the memory cell is verified in a subsequent verify operation, according to one embodiment. To read a memory cell, a read voltage level, which is equal to or greater than the threshold voltage, is applied to a page of memory cells to determine which of the memory cells are programmed to a particular one of the program levels (e.g., L0-L7), according to one embodiment. As disclosed herein, programming state and programming level are used interchangeably.

An advantage of the configuration of the memory controller 112 and of the memory array 114 is that including multiple voltage regulators (e.g., the first voltage regulator 128 and the second voltage regulator 136) in the memory 108 enables the memory 108 to concurrently access multiple pages (e.g., wordlines) at multiple programming levels (e.g., using different threshold voltages) within the memory array 114, according to one embodiment. For example, the first voltage regulator 128 may provide 1.6 V to a first wordline to read memory cells programmed at programming level 2, while the second voltage regulator 136 may provide 3.5 V voltage level to a second wordline to read memory cells programmed at programming level 5, according to one embodiment. By concurrently accessing multiple pages of the memory array 114, the memory controller 112 and the memory 108 enable faster random read times of the memory array 114, according to one embodiment.

The memory controller may also include additional logic to facilitate memory array operations and communication with one or more of the processor 102, the chipset 104, and the peripheral device(s) 106, according to one embodiment. The memory controller 112 may include one or more of memory controller logic 140, error store 142, sense circuitry 144, ECC logic 146, recovery logic 148, parameter store 150, and current source 152, according to one embodiment. The memory controller logic 140 may configured to perform operations associated with memory controller 112. For example, the memory controller logic 140 may manage communications with the processor 102 and may be configured to identify one or more target wordlines associated with each received memory address (e.g., in a read request). The error store 142 includes the fail type for memory read or access fails, according to one embodiment. The sense circuitry 144 may be configured to detect a quantity of current passing through a memory cell, e.g., during a read operation, according to one embodiment. The ECC logic 146 is configured to provide error checking functionality for memory controller 112, according to one embodiment. The recovery logic 148 configured to manage recovery of fail opens and/or set fails for associated memory cells identified by ECC 146 and/or memory controller logic 140, according to one embodiment. The parameter store 150 is configured to store the number of adjacent memory cells to select and parameters associated with a sequence of recovery pulses. The number of adjacent memory cells to select may be based, at least in part, on fail type, memory array density, and/or maximum current available from current source 152, according to one embodiment. The current source 152 supplies current to one or more portions of the memory 108, according to one embodiment.

To facilitate concurrent multiple page read operations at, for example, different voltages, the memory controller 112 may also include duplicate digital-to-analog converters ("DAC") along with the voltage regulators within the first and second wordline control logic 124, 132 and may include duplicate inhibit voltage controller logic within the first and second bitline control logic 116, 120, to support the concurrent multiple page read operations, according to one embodiment.

The memory array 114 may be physically and logically organized into two or more planes of memory cells, according to one embodiment. The memory array 114 includes a first plane 154 and a second plane 156, and the first wordline control logic 124 is configured to access the first plane 154 while the second wordline control logic 132 is configured to access the second plane 156, according to one embodiment. The first plane 154 is a plane 0 and the second plane 156 is a plane 1, according to one embodiment. The memory array 114 includes a third plane 158 and a fourth plane 160, and the first wordline control logic 124 is configured to access the first plane 154 and the third plane 158 while the second wordline control logic 132 is configured to access the second plane 156 and the fourth plane 160, according to one embodiment. The first plane 154 is a plane 0, the third plane 158 is a plane 1, the second plane 156 is a plane 2, and the fourth plane 160 is a plane 3, according to one embodiment. The memory 108 includes the first plane 154, third plane 158, the second plane 156, and the fourth plane 160, according to one embodiment. The memory 108 includes more than four planes or fewer than four planes, according to one embodiment. The planes enable concurrent and/or identical operations on the memory array 114, according to one embodiment. Each of the planes include a number of memory blocks (not shown), and each of the memory blocks include a number of pages of memory cells, according to one embodiment. A memory block is the smallest unit of memory cells that can be erased, according to one embodiment. A page of memory cells is the smallest unity of memory cells that can be programmed, according to one embodiment.

Figure 2:
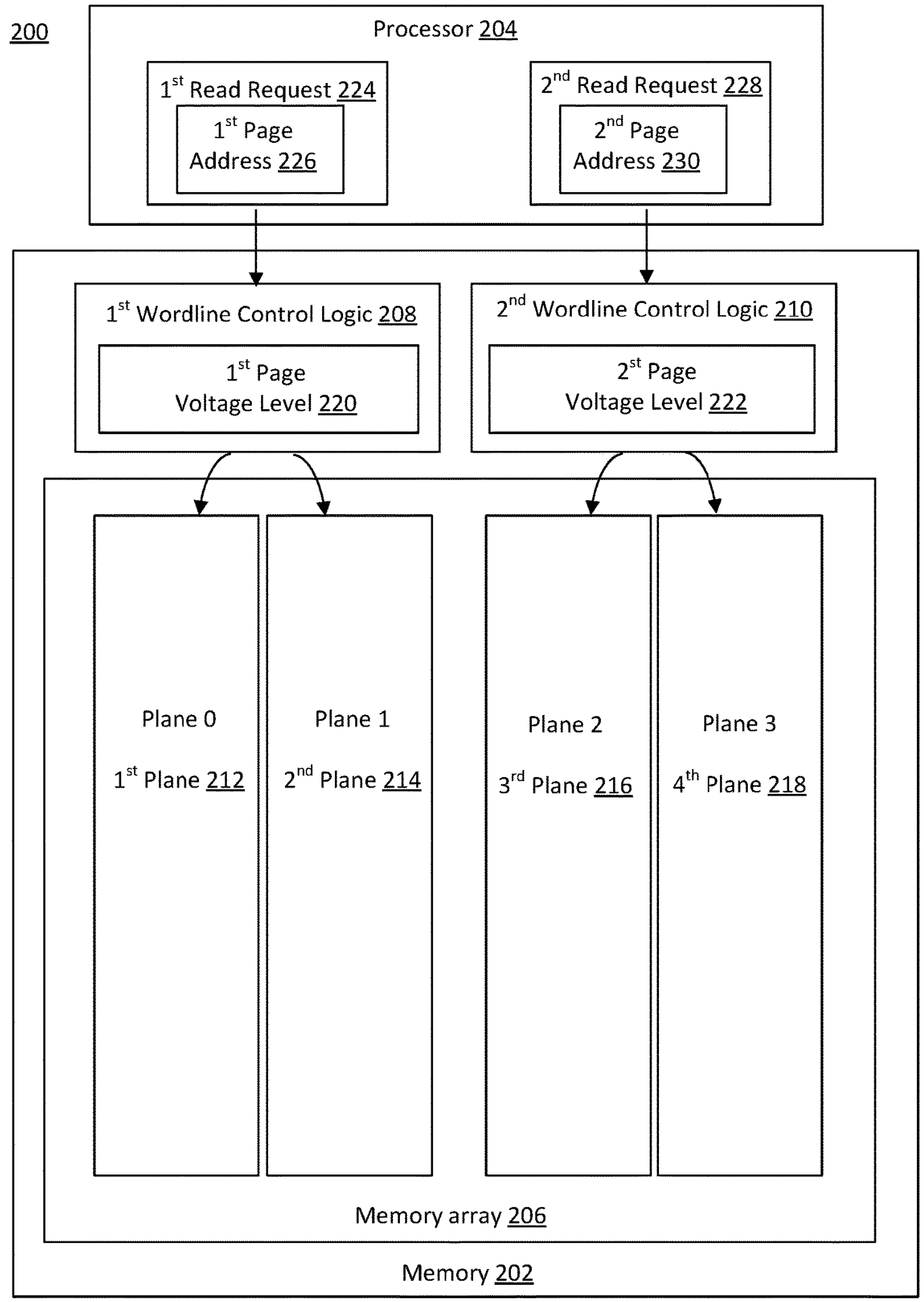
FIG. 2 is an illustrative simplified diagram of a system for performing concurrent multiple page reads of a memory array of a memory, according to one embodiment.

FIG. 2 is an illustrative simplified diagram of a system 200 for performing multiple page reads of a memory array of a memory, according to one embodiment. The system 200 is a simplified illustration of the system 100, according one embodiment. The system 200 includes a memory 202 that receives read requests from a processor 204, according to one embodiment.

The memory 202 includes a memory array 206, a first wordline control logic 208, and a second wordline control logic 210, according to one embodiment. The memory array 206 includes a plurality of memory cells (not shown) that are organized into units of pages, blocks, and planes in the memory array 206, according to one embodiment. The memory array 206 includes a first plane 212, a second plane 214, a third plane 216, and a fourth plane 218, according to one embodiment. The first plane 212 is a plane 0, the second plane 214 is a plane 1, the third plane 216 is a plane 2, the fourth plane 218 is a plane 3 in the memory array 206, according to one embodiment. The first wordline control logic 208 is configured to apply a first page voltage level 220 to either the first plane 212 or to the second plane 214, according to one embodiment. By applying the first page voltage level 220 to either the first plane 212 or to the second plane 214, the first wordline control logic 208 accesses a page of memory cells to enable the page from the first plane 212 or the page from the second plane 214 to be read from the memory 202, according to one embodiment. The second wordline control logic 210 is configured to apply a second voltage level 222 to either the third plane 216 or to the fourth plane 218, concurrently with the first wordline control logic 208 applying the first page voltage level 220 to either the first plane 212 or the second plane 214, according to one embodiment. By applying the second page voltage level 222 to either the third plane 216 or to the fourth plane 218, the second wordline control logic 210 accesses a page of memory cells to enable the page from the third plane 216 or from the fourth plane 218 to be read from the memory 202, according to one embodiment.

The first wordline control logic 208 determines and applies the first page voltage level 220 in response to receipt of a first read request 224 from the processor 204, according to one embodiment. The first read request to 224 includes a first page address 226, according to one embodiment.

The second wordline control logic 210 determines and applies the second page voltage level 222 in response to receipt of a second read request 228 from the processor 204, according to one embodiment. The second read request 228 includes a second page address 230, according to one embodiment.

Figure 3:
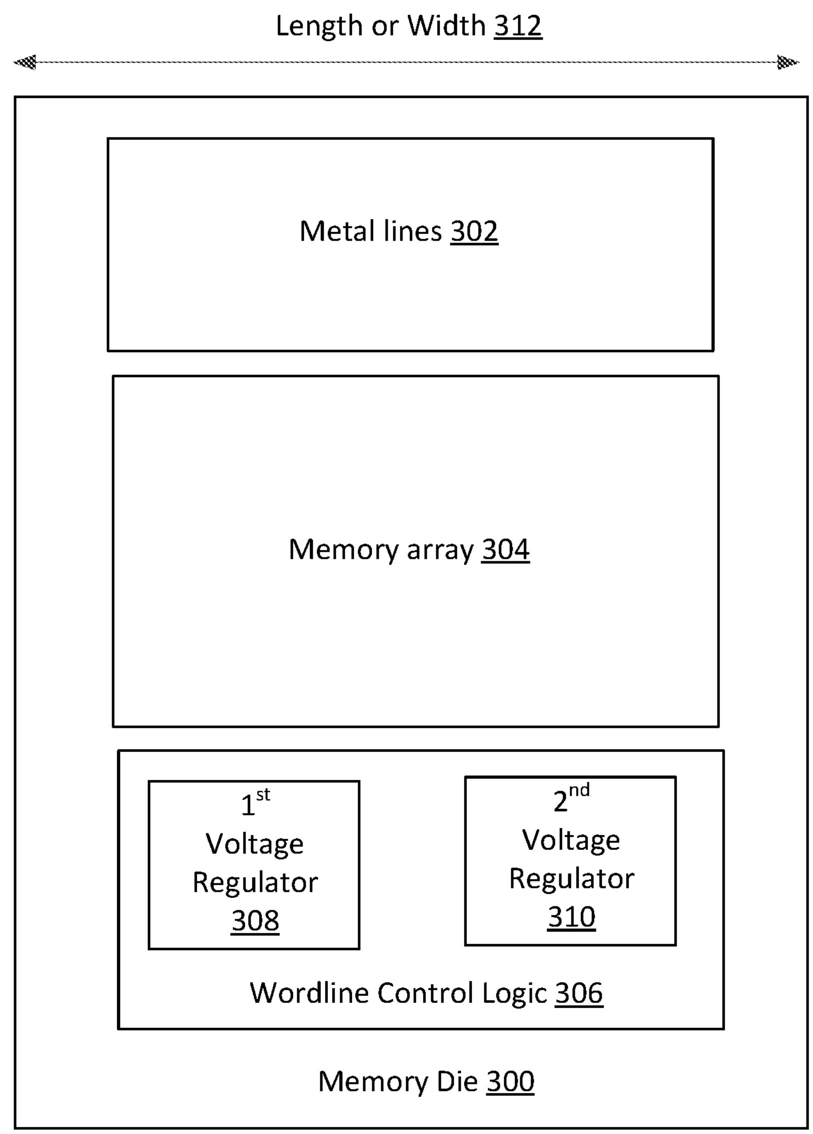
FIG. 3 is a simplified diagram of an illustrative memory die configured to provide concurrent multiple page read operations, according to one embodiment.

FIG. 3 is an illustrative simplified side view of a memory die 300 that is configured to provide concurrent multiple page read operations, while using CMOS under the array fabrication techniques to maintain pre-existing dimensions of the memory die 300, in accordance with at least one embodiment described herein. The memory die 300 is an example implementation of the memory 108 (shown in FIG. 1) and of the memory 202 (shown in FIG. 2), according to one embodiment.

The memory die 300 includes metal lines 302 (e.g., bitlines) disposed on top of a memory array 304, according to one embodiment. The memory array 304 is disposed on top of wordline control logic 306, according to one embodiment. The wordline control logic 306 includes a first voltage regulator 308 and a page voltage regulator 310, fabricated under the memory array 304, according to one embodiment.

The memory die 300 includes a length or width 312, according to one embodiment. By fabricating the second voltage regulator 310 using CMOS under the array fabrication, or otherwise under the memory array 304, the length or width 312 may not be affected by the addition of the second voltage regulator 310, according to one embodiment.

Figure 4:
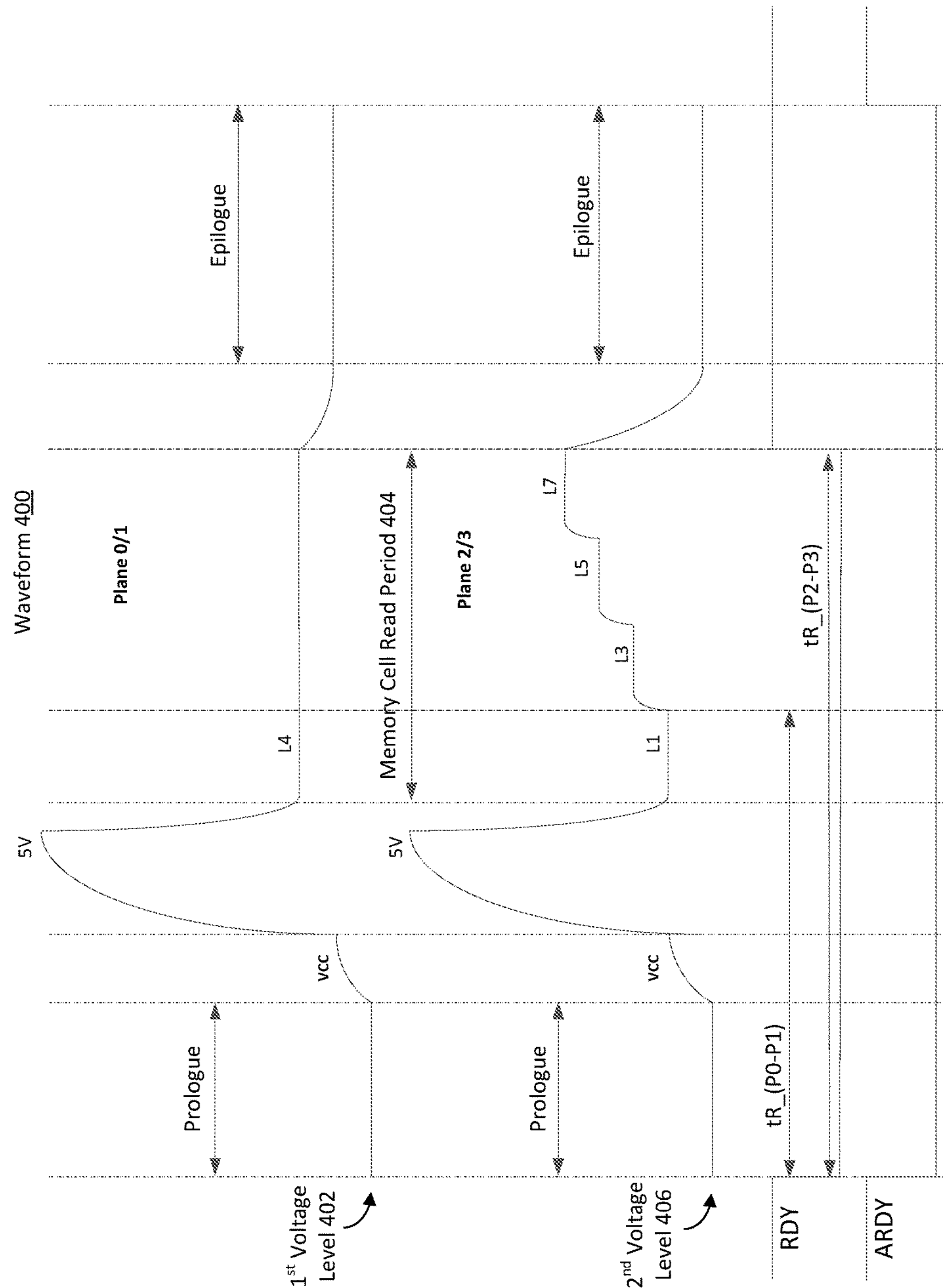
FIG. 4 is an illustrative waveform diagram of performing concurrent multiple page reads of a flash memory, according to one embodiment.

FIG. 4 is an illustrative waveform diagram 400 of performing multiple page reads of a flash memory, according to one embodiment. As illustrated, a first voltage level 402 is applied to a page in a first plane or a second plane (e.g., plane 0 or plane 1) using a first voltage regulator, according to one embodiment. In waveform diagram 400, the first voltage level 402 is greater than or equal to a threshold voltage of programming level 4 ("L4") memory cells and is less than a threshold voltage for programming level 5 ("L5") memory cells, during a memory cell read period 404, according to one embodiment.

As illustrated, during the memory cell read period 404, a second voltage level 406 is applied to a page in a third plane or a fourth plane (e.g., plane 2 or plane 3) using a second voltage regulator, according to one embodiment. In waveform diagram 400, the second voltage level 406 is used to sequentially read multiple programming levels from a page of memory cells, according to one embodiment. The second voltage level 406 is generated to voltage levels that read programming level 1 ("L1") memory cells, programming level 3 ("L3") memory cells, programming level 5 ("L5") memory cells, and programming level 7 ("L7") memory cells, during the memory cell read period 404, according to one embodiment.

Figure 5:
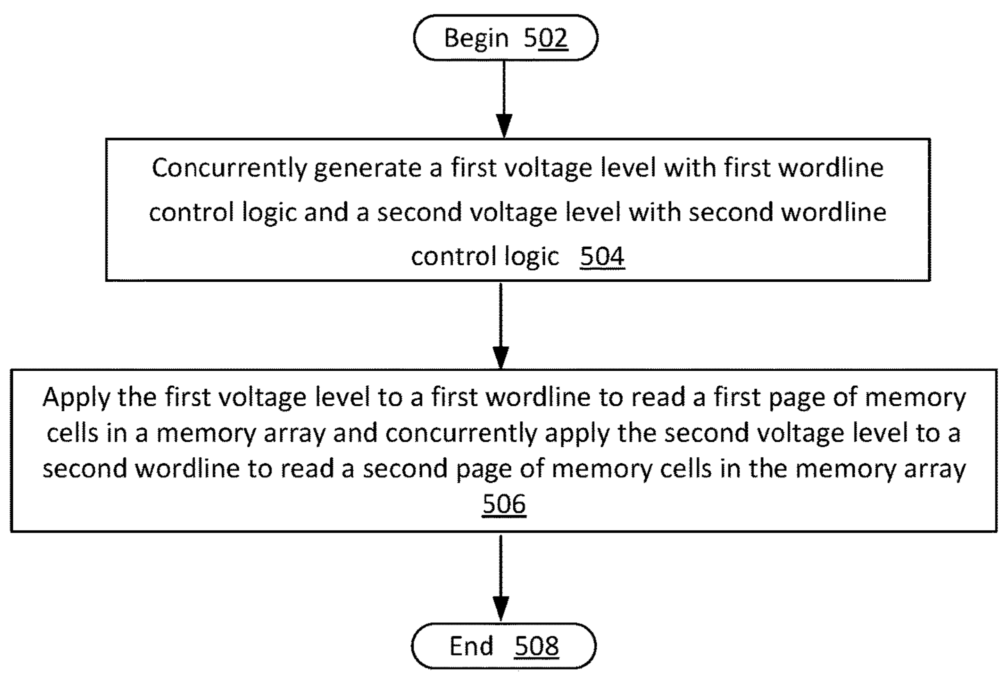
FIG. 5 is a high-level logic flow diagram of an illustrative method of performing a concurrent multiple page read of a memory array, according to one embodiment.

FIG. 5 is a high-level logic flow diagram of an illustrative method 500 for performing a concurrent multiple page read of a memory array, in accordance with at least one embodiment described herein. The method 500 begins at 502.

At 504, the method 500 includes concurrently generating a first voltage level with first wordline control logic and a second voltage level with second wordline control logic, according to one embodiment.

At 506, the method 500 includes applying the first voltage level to a first wordline to read a first page of memory cells in a memory array and concurrently apply the second voltage level to a second wordline to read a second page of memory cells in the memory array, according to one embodiment.

Generating and applying the first voltage level to a first wordline and a second voltage to a second wordline is performed in response to receiving a command or an instruction to read multiple planes, according to one embodiment. For example, a READ PAGE MULTI-PLANE command or instruction may include hexadecimal (0x00, 0x32) bytes transmitted to a command register (e.g., within memory control logic) within a memory die, according to one embodiment. In one embodiment, a READ PAGE MULTI-PLANE command causes a memory die to queue and transfer six or more page data to cache registers for transfer off-chip, in response to the read request. In one embodiment, the READ PAGE MULTI-PLANE command is initiated with receipt of an initiate command (e.g., 0x00) to a command register, is defined by multiple memory addresses transmitted to the command register, and is executed with an execute command (e.g., 0x00) to the command register. In one embodiment, one page of memory is 8 kilobytes of data.

The method 500 ends at 508.

Additionally, operations for the embodiments have been further described with reference to the above figures and accompanying examples. Some of the figures may include a logic flow. Although such figures presented herein may include a particular logic flow, it can be appreciated that the logic flow merely provides an example of how the general functionality described herein can be implemented. Further, the given logic flow does not necessarily have to be executed in the order presented unless otherwise indicated. The embodiments are not limited to this context.

Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications. Thus, the breadth and scope of the present invention should not be limited by any of the above-described exemplary embodiments, but should be defined only in accordance with the following claims and their equivalents.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents. Various features, aspects, and embodiments have been described herein. The features, aspects, and embodiments are susceptible to combination with one another as well as to variation and modification, as will be understood by those having skill in the art. The present disclosure should, therefore, be considered to encompass such combinations, variations, and modifications.

Reference throughout this specification to "one embodiment", "an embodiment", or "an implementation" means that a particular feature, structure, or characteristic described in connection with the embodiment is included in at least one embodiment. Thus, appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in any embodiment herein, the term "logic" may refer to an application, software, firmware and/or circuitry configured to perform any of the aforementioned operations. Software may be embodied as a software package, code, instructions, instruction sets and/or data recorded on non-transitory computer readable storage medium. Firmware may be embodied as code, instructions or instruction sets and/or data that are hard-coded (e.g., nonvolatile) in memory devices.

"Circuitry," as used in any embodiment herein, may comprise, for example, singly or in any combination, hardwired circuitry, programmable circuitry, state machine circuitry, logic and/or firmware that stores instructions executed by programmable circuitry. The circuitry may be embodied as an integrated circuit, such as an integrated circuit chip. In some embodiments, the circuitry may be formed, at least in part, within the memory controller 112 that executes code and/or instructions sets (e.g., software, firmware, etc.) corresponding to the functionality described herein, thus transforming a general-purpose processor into a specific-purpose processing environment to perform one or more of the operations described herein. In some embodiments, the various components and circuitry of the memory controller circuitry or other systems may be combined in a system-on-a-chip (SoC) architecture.

Embodiments of the operations described herein may be implemented in a computer-readable storage device having stored thereon instructions that when executed by one or more processors perform the methods. The processor may include, for example, a processing unit and/or programmable circuitry. The storage device may include a machine readable storage device including any type of tangible, non-transitory storage device, for example, any type of disk including floppy disks, optical disks, compact disk read-only memories (CD-ROMs), compact disk rewritables (CD-RWs), and magneto-optical disks, semiconductor devices such as read-only memories (ROMs), random access memories (RAMs) such as dynamic and static RAMs, erasable programmable read-only memories (EPROMs), electrically erasable programmable read-only memories (EEPROMs), flash memories, magnetic or optical cards, or any type of storage devices suitable for storing electronic instructions.

In some embodiments, a hardware description language (HDL) may be used to specify circuit and/or logic implementation(s) for the various logic and/or circuitry described herein. For example, in one embodiment the hardware description language may comply or be compatible with a very high speed integrated circuits (VHSIC) hardware description language (VHDL) that may enable semiconductor fabrication of one or more circuits and/or logic described herein. The VHDL may comply or be compatible with IEEE Standard 1076-1987, IEEE Standard 1076.2, IEEE1076.1, IEEE Draft 3.0 of VHDL-2006, IEEE Draft 4.0 of VHDL-2008 and/or other versions of the IEEE VHDL standards and/or other hardware description standards.

In some embodiments, a Verilog hardware description language (HDL) may be used to specify circuit and/or logic implementation(s) for the various logic and/or circuitry described herein. For example, in one embodiment, the HDL may comply or be compatible with IEEE standard 62530-2011: SystemVerilog—Unified Hardware Design, Specification, and Verification Language, dated Jul. 7, 2011; IEEE Std 1800TM-2012: IEEE Standard for SystemVerilog-Unified Hardware Design, Specification, and Verification Language, released Feb. 21, 2013; IEEE standard 1364-2005: IEEE Standard for Verilog Hardware Description Language, dated Apr. 18, 2006 and/or other versions of Verilog HDL and/or SystemVerilog standards.

EXAMPLES

Examples of the present disclosure include subject material such as a memory controller, a method, and a system related to improving memory array read rates, as discussed below.

Example 1

According to this example, there is provided a memory controller. The memory controller includes first wordline control logic to generate a first voltage level to apply to first wordlines of a memory array of memory cells; and second wordline control logic to generate a second voltage level to apply to second wordlines of the memory array of memory cells concurrent with the first wordline control logic generating the first voltage level.

Example 2

This example includes the elements of example 1, wherein the first voltage level enables access of first ones of the memory cells that store a first programming level, wherein the second voltage level enables access of second ones of the memory cells that store a second programming level.

Example 3

This example includes the elements of example 1, wherein the first wordline control logic includes a first voltage regulator to generate the first voltage level, wherein the second wordline control logic includes a second voltage regulator to generate the second voltage level.

Example 4

This example includes the elements of example 1, wherein the first voltage level is independent of the second voltage level.

Example 5

This example includes the elements of example 1, wherein the first wordlines provide access to a first plane of the memory cells, wherein the second wordlines provide access to a second plane of the memory cells.

Example 6

This example includes the elements of example 1, wherein the memory array of memory cells includes at least four planes of the memory cells, wherein the first wordline control logic is coupled to the memory array to access a first plane of the memory cells and a second plane of the memory cells, wherein the second wordline control logic is coupled to the memory array to access a third plane of the memory cells and a fourth plane of the memory cells.

Example 7

This example includes the elements of example 1, wherein the first wordline control logic and the second wordline control logic are at least partially fabricated in a die under the memory array.

Example 8

This example includes the elements of example 1, wherein each of the memory cells is to store at least four programming levels and each of the four programming levels is read with one of four threshold voltage levels.

Example 9

This example includes the elements of example 1, wherein concurrent operation of the first wordline control logic and the second wordline control logic enables decreased random read time of the memory array.

Example 10

This example includes the elements of example 1, wherein each of the memory cells is to store one of a plurality of programming levels, the plurality of programming levels corresponding to at least two of bits of data, wherein the first wordline control logic is to access a first plurality of pages of the memory cells at a first of the plurality of programming levels with the first voltage level, wherein the second wordline control logic is to access a second plurality of pages of the memory cells at a second of the plurality of programming levels with the second voltage level.

Example 11

According to this example, there is provided a system. The system includes a memory array having a plurality of memory cells, wherein each of the memory cells is to store at least four programming levels that corresponds with at least two bits of data. The system includes a memory controller having first wordline control logic to generate a first voltage level to apply to first wordlines of the memory array; and second wordline control logic to generate a second voltage level to apply to second wordlines of the memory array concurrent with the first wordline control logic generating the first voltage level.

Example 12

This example includes the elements of example 11, wherein the system is one of a desktop computer, a laptop, a smart phone, a mobile device, and a computer networking device.

Example 13

This example includes the elements of example 11, further including one or more of a processor, a chipset, and one or more peripheral devices.

Example 14

This example includes the elements of example 11, wherein the memory array and the memory controller are included in a single memory die.

Example 15

This example includes the elements of example 11, wherein the first voltage level enables access of first ones of the plurality of memory cells that store a first of the at least four programming levels, wherein the second voltage level enables access of second ones of the plurality of memory cells that store the second of the at least four programming levels.

Example 16

This example includes the elements of example 11, wherein the first wordline control logic includes a first voltage regulator to generate the first voltage level, wherein the second wordline control logic includes a second voltage regulator to generate the second voltage level.

Example 17

This example includes the elements of example 11, wherein the memory array includes at least four planes of the plurality of memory cells, wherein the first wordline control logic is coupled to the memory array to access a first plane of the plurality of memory cells and a second plane of the plurality of memory cells, wherein the second wordline control logic is coupled to the memory array to access a third plane of the plurality of memory cells and a fourth plane of the plurality of memory cells.

Example 18

This example includes the elements of example 11, wherein concurrent operation of the first wordline control logic and the second wordline control logic enables decreased random read time of the memory array.

Example 19

According to this example, there is provided a computer readable storage device. The computer readable storage device stored instructions that when executed by one or more processors result in operations. The operations include concurrently generate a first voltage level with first wordline control logic and a second voltage level with second wordline control logic; and apply the first voltage level to a first wordline to read a first page of memory cells in a memory array and concurrently apply the second voltage level to a second wordline to read a second page of memory cells in the memory array.

Example 20

This example includes the elements of example 19, wherein each of the memory cells is to store a plurality of programming levels corresponding to a plurality of bits of data, the operations further including read the first page of memory cells in the memory array at a first of the plurality of programming levels with the first voltage level; and read the second page of memory cells in the memory array at a second programming level with the second voltage level.

Example 21

This example includes the elements of example 19, wherein the first wordline control logic includes a first voltage generator to generate the first voltage level, wherein the second wordline control logic includes second voltage generator to generate the second voltage level.

Example 22

According to this example, there is provided a method. The method includes concurrently generating a first voltage level with first wordline control logic and a second voltage level with second wordline control logic; and applying the first voltage level to a first wordline to read a first page of memory cells in a memory array and concurrently apply the second voltage level to a second wordline to read a second page of memory cells in the memory array.

Example 23

This example includes the elements of example 22, wherein each of the memory cells is to store a plurality of programming levels corresponding to a plurality of bits of data, wherein the elements further include reading the first page of memory cells in the memory array at a first of the plurality of programming levels with the first voltage level; and reading the second page of memory cells in the memory array at a second of the plurality of programming levels with the second voltage level.

Example 24

This example includes the elements of example 23, wherein the first page of memory cells is within a first plane or a second plane, wherein the second page of memory cells is within a third plane or a fourth plane.

Example 25

This example includes the elements of example 24, wherein the first plane is plane 0, the second plane is plane 1, the third plane is plane 2, and the fourth plane is plane 3.

Example 26

This example includes the elements of example 23, wherein the plurality of programming levels includes at least seven programming levels.

Example 27

This example includes the elements of example 26, wherein each of the at least seven programming levels is accessed with one of at least seven threshold voltage levels.

Example 28

This example includes the elements of example 22, wherein the first wordline control logic includes a first voltage generator to generate the first voltage level, wherein the second wordline control logic includes second voltage generator to generate the second voltage level.

Example 29

According to this example, there is provided a memory controller. The memory controller includes means for concurrently generating a first voltage level with first wordline control logic and a second voltage level with second wordline control logic; and means for applying the first voltage level to a first wordline to read a first page of memory cells in a memory array and concurrently apply the second voltage level to a second wordline to read a second page of memory cells in the memory array.

Example 30

This example includes the elements of example 29, wherein each of the memory cells is to store a plurality of programming levels corresponding to a plurality of bits of data, wherein the memory controller further includes means for reading the first page of memory cells in the memory array at a first of the plurality of programming levels with the first voltage level; and means for reading the second page of memory cells in the memory array at a second of the plurality of programming levels with the second voltage level.

Example 31

This example includes the elements of example 30, wherein the first page of memory cells is within a first plane or a second plane, wherein the second page of memory cells is within a third plane or a fourth plane.

Example 32

This example includes the elements of example 31, wherein the first plane is plane 0, the second plane is plane 1, the third plane is plane 2, and the fourth plane is plane 3.

Example 33

This example includes the elements of example 30, wherein the plurality of programming levels includes at least seven programming levels.

Example 34

This example includes the elements of example 33, wherein each of the at least seven programming levels is accessed with one of at least seven threshold voltage levels.

Example 35

This example includes the elements of example 29, wherein the first wordline control logic includes a first voltage generator to generate the first voltage level, wherein the second wordline control logic includes second voltage generator to generate the second voltage level.

Example 36

According to this example, there is provided the system of any one of examples 11 to 17, further including processor circuitry.

Example 37

According to this example, there is provided a device comprising means to perform the method of any one of examples 22 to 28.

Example 38

According to this example, there is provided a computer readable storage device having stored thereon instructions that when executed by one or more processors result in operations including the method according to any one of examples 22 to 28.

The terms and expressions which have been employed herein are used as terms of description and not of limitation, and there is no intention, in the use of such terms and expressions, of excluding any equivalents of the features shown and described (or portions thereof), and it is recognized that various modifications are possible within the scope of the claims. Accordingly, the claims are intended to cover all such equivalents.

What is claimed:

1. A memory controller, comprising:

first wordline control logic to apply a first voltage level to multiple first wordlines of a memory array of memory cells; and second wordline control logic to apply, concurrently with the first wordline control logic applying the first voltage level to the multiple first wordlines, a second voltage level to multiple second wordlines of the memory array of memory cells;

wherein the first wordlines provide access to a first plane of the memory cells, and wherein the second wordlines provide access to a second plane of the memory cells.

2. The memory controller of claim 1, wherein the first voltage level enables access of first ones of the memory cells that store a first programming level, wherein the second voltage level enables access of second ones of the memory cells that store a second programming level.

3. The memory controller of claim 1, wherein the first wordline control logic includes a first voltage regulator to generate the first voltage level, wherein the second wordline control logic includes a second voltage regulator to generate the second voltage level.

4. The memory controller of claim 1, wherein the first voltage level is independent of the second voltage level.

5. The memory controller of claim 1, wherein the memory array of memory cells includes at least four planes of the memory cells, wherein the first wordline control logic is coupled to the memory array to access a first plane of the memory cells and a second plane of the memory cells, wherein the second wordline control logic is coupled to the memory array to access a third plane of the memory cells and a fourth plane of the memory cells.

6. The memory controller of claim 1, wherein the first wordline control logic and the second wordline control logic are fabricated in a die under the memory array.

7. The memory controller of claim 1, wherein each of the memory cells is to store at least four programming levels and each of the at least four programming levels is read with one of at least four threshold voltage levels.

8. The memory controller of claim 1, wherein concurrent operation of the first wordline control logic and the second wordline control logic enables decreased random read time of the memory array.

9. The memory controller of claim 1, wherein each of the memory cells is to store one of a plurality of programming levels, the plurality of programming levels corresponding to at least two of bits of data, wherein the first wordline control logic is to access a first plurality of pages of the memory cells at a first of the plurality of programming levels with the first voltage level, wherein the second wordline control logic is to access a second plurality of pages of the memory cells at a second of the plurality of programming levels with the second voltage level.

10. A system, comprising:

a memory array having a plurality of memory cells, wherein each of the memory cells is to store at least four programming levels that corresponds with at least two bits of data; and a memory controller, including:

first wordline control logic to apply a first voltage level to multiple first wordlines of the memory array; and second wordline control logic to apply, concurrently with the first wordline control logic applying the first voltage level to the multiple first wordlines, a second voltage level to multiple second wordlines of the memory array;

wherein the first wordlines provide access to a first plane of the memory cells, and wherein the second wordlines provide access to a second plane of the memory cells.

11. The system of claim 10, wherein the system is one of a desktop computer, a laptop, a smart phone, a mobile device, and a computer networking device.

12. The system of claim 10, further comprising:

one or more of a processor, a chipset, and one or more peripheral devices.

13. The system of claim 10, wherein the memory array and the memory controller are included in a solid-state drive.

14. The system of claim 10, wherein the first voltage level enables access of first ones of the plurality of memory cells that store a first of the at least four programming levels, wherein the second voltage level enables access of second ones of the plurality of memory cells that store the second of the at least four programming levels.

15. The system of claim 10, wherein the first wordline control logic includes a first voltage regulator to generate the first voltage level, wherein the second wordline control logic includes a second voltage regulator to generate the second voltage level.

16. The system of claim 10, wherein the memory array includes at least four planes of the plurality of memory cells, wherein the first wordline control logic is coupled to the memory array to access a first plane of the plurality of memory cells and a second plane of the plurality of memory cells, wherein the second wordline control logic is coupled to the memory array to access a third plane of the plurality of memory cells and a fourth plane of the plurality of memory cells.

17. The system of claim 10, wherein concurrent operation of the first wordline control logic and the second wordline control logic enables decreased random read time of the memory array.

18. A memory device, comprising:

first wordline control logic to apply a first voltage level to first wordlines of a memory array of memory cells; and second wordline control logic to apply, concurrently with the first wordline control logic applying the first voltage level to the first wordlines, a second voltage level to second wordlines of the memory array of memory cells;

wherein the first wordlines provide access to a first plane of the memory cells, and wherein the second wordlines provide access to a second plane of the memory cells.

19. The memory device of claim 18, wherein each of the memory cells is to store a plurality of programming levels corresponding to a plurality of bits of data, the memory device further comprising:

bitline control logic and sense circuitry to:

read a first page of memory cells in the memory array at a first of the plurality of programming levels with the first voltage level; and read a second page of memory cells in the memory array at a second programming level with the second voltage level.

20. The memory device of claim 18, wherein the first wordline control logic includes a first voltage generator to generate the first voltage level, wherein the second wordline control logic includes second voltage generator to generate the second voltage level.

21. A method, comprising:

concurrently generating a first voltage level with first wordline control logic and a second voltage level with second wordline control logic; and applying the first voltage level to a first wordline to read a first page of memory cells in a memory array and concurrently applying the second voltage level to a second wordline to read a second page of memory cells in the memory array;

wherein applying the first voltage level to the first wordlines provides access to a first plane of the memory cells, and wherein applying the second voltage level to the second wordlines provide access to a second plane of the memory cells.

22. The method of claim 21, wherein each of the memory cells is to store a plurality of programming levels corresponding to a plurality of bits of data, the method further comprising:

reading the first page of memory cells in the memory array at a first of the plurality of programming levels with the first voltage level; and reading the second page of memory cells in the memory array at a second programming level with the second voltage level.

23. The method of claim 21, wherein the first wordline control logic includes a first voltage generator to generate the first voltage level, wherein the second wordline control logic includes second voltage generator to generate the second voltage level.

* * * * *